United States Patent [19]
Savant

[11] Patent Number: 5,288,240
[45] Date of Patent: Feb. 22, 1994

[54] TOP-LOAD SOCKET FOR INTEGRATED CIRCUIT DEVICE

[75] Inventor: John A. Savant, Austin, Tex.

[73] Assignee: Minnesota Mining and Manufacturing Company, St. Paul, Minn.

[21] Appl. No.: 992,478

[22] Filed: Dec. 16, 1992

[51] Int. Cl.[5] .......................................... H01R 11/22
[52] U.S. Cl. .................................. 439/266; 439/331; 439/70
[58] Field of Search ............... 439/259, 264, 266, 270, 439/330, 331, 70, 71, 72, 73

[56] References Cited

U.S. PATENT DOCUMENTS

| | | | |
|---|---|---|---|
| 4,691,975 | 9/1987 | Fukunaga et al. | 439/266 |
| 4,846,703 | 7/1989 | Matsuoka et al. | 439/71 |
| 4,886,470 | 12/1989 | Billman et al. | 439/266 |
| 4,993,955 | 2/1991 | Savant | 439/73 |
| 5,009,609 | 4/1991 | Matsuoka et al. | 439/266 |
| 5,076,798 | 12/1991 | Uratsuji | 439/73 |
| 5,114,358 | 5/1992 | Myers | 439/266 |
| 5,186,641 | 2/1993 | Uratsuji | 439/266 |

FOREIGN PATENT DOCUMENTS 4154065  5/1992  Japan .................................. 439/331

OTHER PUBLICATIONS

Japanese Laid-open application No. 4-154065.

*Primary Examiner*—Larry I. Schwartz
*Assistant Examiner*—Hien D. Vu
*Attorney, Agent, or Firm*—Gary L. Griswold; Walter N. Kirn; John C. Barnes

[57] ABSTRACT

A socket assembly for top-loading IC devices having a cam member, actuated by a vertically moving top plate, positioned for engaging the contact elements and retracting the contacting portions thereof to allow insertion or removal of the IC device in relationship to the socket assembly. The cam member rests on top of the contact elements and is cradled below the contacting portions to be readily assembled after the contact elements have been placed in the socket body.

5 Claims, 2 Drawing Sheets

TOP-LOAD SOCKET FOR INTEGRATED CIRCUIT DEVICE

BACKGROUND OF THE INVENTION

1. Field of the Invention

The present invention relates to an improved socket assembly for use with an integrated circuit device or package (IC), which assembly comprises a socket body, a plurality of contact elements, a top plate and a cam member for opening the contact elements upon movement of the top plate toward the body, and in one aspect to an improved cam design.

2. Description of the Prior Art

Top loading sockets for integrated circuit devices or packages (IC's) are known and are used to connect IC's to printed circuit boards for test or burn-in by automated operations, or for the functional application affording the replacement of the IC without subjecting other components on a printed circuit board or the like to heat, to afford the removal or replacement of the IC. To this end there have been sockets designed to afford the top-loading of the IC, whether the IC is leaded or leadless.

Examples of the sockets or carriers of the prior art using a cam member to move the contact members to an open position include applicant's own U.S. Pat. No. 4,993,955 disclosing a carrier for an IC device which has leads and which has a cam member inserted on the socket body to withdraw the contacts, against their inherent biasing force, from a contacting position to a retracted position upon the movement of the top plate toward the socket body. There are other patents which show a top load socket having similar top load characteristics but these sockets have the cover engaging each of the plurality of contacts directly to retract the same.

Another known application disclosing cam members for opening the contact elements of a top load socket is Japanese Laid-Open application No. 4-154065 having a Laid-Open date of May 27, 1992. The structure of FIGS. 8(A) and 8(B) are the only views showing a cam design wherein the cam is positioned above the contact elements and serves to move them from an operating position to an open position. In this example, however, the cam is secured to the contact element and is fulcrumed about a member disposed above the center of the spring portion of the contact elements and lifts the contacting portion from the IC lead. The cam is apparently operated by the outer edge of a top plate in a manner corresponding to that shown in FIGS. 4(A), (B) and (C) and similar to the top plate described in U.S. Pat. No. 4,846,703.

A difficulty with the prior art socket assemblies using the cam design is the fact that they are difficult to manufacture. This difficulty arises due to the fact the contacts have to be inserted into the anchoring recesses in the socket body and then the contact elements have to be moved to a retracted position to permit assembly of the cam member into the cradle. This is the case with the assembly described in U.S. Pat. No. 4,993,955. Thereafter, the cover plate and the cam member serve to open the contacts with ease to afford the insertion and/or removal of the IC device. Additionally, the cam designs have used the cam followers located at the opposite ends of the cam member and there was the possibility of a torsional loading being applied to the cam member if the opening forces were not evenly applied to the top plate to retract the contact elements to the open position.

The socket assembly of the present invention affords a structure which is easily assembled without danger of overstressing or bending the contact elements in assembling the cam member.

The socket assembly of the present invention affords positive movement of the contacting portion of the contact.

The socket assembly of the present invention affords a cam member design which evenly distributes the actuating force along the length of the cam member. The new design restricts torsional distribution of the loading force on the cam member.

The contacts have a profile which affords a substantial reduction in the cantilevered portions which have to carry the load for retracting the contact elements.

The socket assembly is of a design which reduces the number of dimensionally critical features on each part.

SUMMARY OF THE INVENTION

The socket assembly of the present invention is adapted for use with an integrated circuit device having a plurality of leads arranged along at least one side of the device. The assembly comprises a socket body forming the support frame for the contacts, the IC device and the retracting elements. The socket body has a generally rectangular configuration. The socket body is provided with spacers along at least one side for receiving a plurality of contact elements. The contact elements are generally planar and are disposed in spaced parallel relationship along the side or sides of the socket body and each contact element comprises a terminal for connecting the contact element with an external electronic member, an anchor for anchoring the contact element to the socket body, a head having a contacting portion for making resilient pressure contact with a lead or the contact point of an integrated circuit device, and a resilient portion affording the movement of said contacting means from a first normal partially loaded position to a retracted flexed open position for receiving an integrated circuit device and its return to an operative position in pressure electrical contact with a lead on the IC device. A cam member is positioned above and along the outside edge of said contact elements at the sides of the socket body, and is supported by the socket body for engaging a lobe on the head of the contact elements adjacent the contacting portion to urge the contacting portion thereof from said normal position to the open position. The cam member is operative upon movement of a top plate or cover supported above the socket body, which top plate is mounted for sliding movement in relationship to said socket body from a first position to a second position, affording movement of the contact element engaging portion of the cam member for moving the contact elements to an open position upon movement of said top plate toward the socket body and to release the contact elements upon movement thereof in a direction away from the socket body.

BRIEF DESCRIPTION OF THE DRAWINGS

The present invention will be described in detail with reference to the accompanying drawing wherein.

DESCRIPTION OF THE PREFERRED EMBODIMENT

The socket assembly of the present invention provides a positive acting cam for moving the contacting portions of the contacts from a first normal partially loaded rest position, to an open IC device receiving position, and then to the pressure contacting electrical connection position with the leads or contact points of an IC device placed in the socket assembly. The cam member affords positive engagement with the contacts and restricts displacement of the contacting portions thereof.

Figure 1:
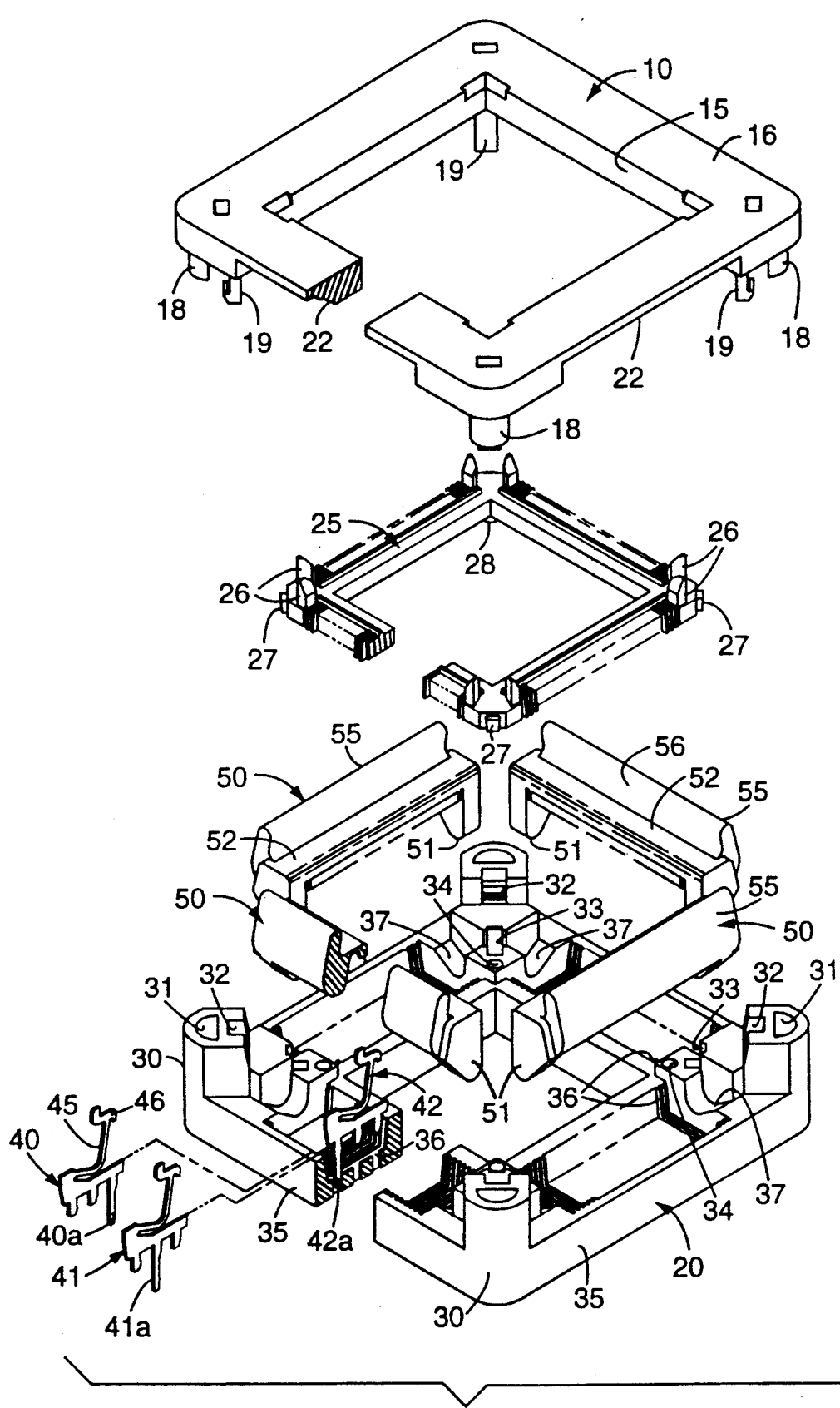
FIG. 1 is an exploded perspective view of the socket assembly of the present invention, with parts partially broken away and contact elements removed for purposes of illustration.
Figure 2:
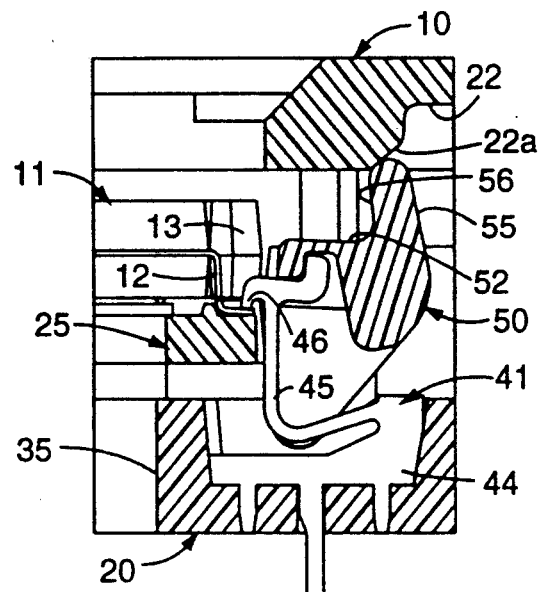
FIG. 2 is a fragmentary vertical sectional view of one side of the assembled socket assembly with an IC device shown in position in the socket assembly with the contact elements in the engaged position on the leads of the IC device.

Referring now to FIG. 1, there is illustrated a socket assembly in exploded form for use with an IC device, which socket assembly is a top loading socket to facilitate automated loading and unloading of the socket to test and burn-in IC devices rapidly. The socket assembly comprises a guide member or top plate 10 of generally rectangular shape, in this embodiment it is square, to receive a QFP (quad flat pack IC) 11 (see FIGS. 2, 3 and 4) having gull wing leads 12 along all four sides in close spaced relationship and bumpers 13 at the corners. The top plate 10 has a central opening 15 extending between an upper surface 16 and the lower surface. At the corners, and descending from the lower surface, are guide members 18 and hook members 19 which guide the vertical movement of the top plate 10 and retain the top plate 10 on the socket body 20. Formed along the outer sides of the top plate 10 and on the lower surface are cam surfaces 22. In FIG. 1 the cam surfaces 22 are illustrated in section where one side is broken away to show the sectional view.

An IC device support frame 25 is shown in FIG. 1, has a rectangular configuration with multiple sides with recesses formed therein to receive the gull wing leads of the QFP 11 and upright guide members 26 at the corners to receive and support therebetween the bumpers 13 of the QFP 11. The corners of the frame 25 are provided with locking projections 27 and descending posts 28.

A socket body 20, which is also rectangular in plan view, has towers or buttresses 30 at the corners. The buttresses 30 are formed with openings 31 to receive the guide members 18 and inner recesses 32 to receive and lockingly engage the hooks 19 to secure the top plate to the socket body. The end surfaces of the buttresses 30 form stops to engage the lower surface of the top plate at the corners. The socket body 20 is symmetrical and has four sides 35. Each side has a plurality of slotted parallel side-by-side openings 36 with holes extending therefrom through the sides to the bottom surface, each to receive a contact element 40, 41 or 42. At each end, on the upper surface, of each of the sides 35 is a cradle 37 for receiving and journaling one end of a cam member 50, to be hereinafter described.

The contact elements 40, 41 and 42 are stamped from flat conductive sheet stock and are provided with connecting portions or terminals in the form of pin members 40a, 41a and 42a, respectively, positioned at different locations along an anchoring bar 44 forming the base of the contact elements. The pin members are formed to engage separate via openings in an electronic member such as a printed circuit board. The contact elements are positioned along the sides 35 in the desired pattern and are securely anchored in the slotted openings 36 by the anchoring bars 44. Above each bar 44 of a contact element is a portion 45 affording resilient movement of the contact distal end. The resilient portion 45 is arcuate and extends inwardly and upwardly and terminates in a head formed with a contacting portion 46 and a lobe 47 to be engaged by the cam member 50. The contacting portion 46 which engages the lead 12 of the IC device extends inwardly and downwardly from the resilient portion 45 and the cam engaging lobe extends outwardly and upwardly.

The cam members 50 are formed of a rigid insulative polymeric material and have a trunnion or rocker arm 51 at each end which is received in the cradle 37 on the sides 25 of the socket body 20. Between the rocker arms 51 is the support bar 52 formed with a plurality of recesses 54 positioned along the surface between the rocker arms 51. The recesses 54 are formed the receive the lobes 47 and to separate the terminal ends of the contact elements 40, 41 and 42 as is done by the openings 36 in the sides 35. Extending away from the bar 52 in a direction opposite the rocker arms 51 is a cam follower 55 extending substantially the length of the cam member 50. The cam follower 55 has a uniform curved surface 56 on the inner surface to engage a cam surface 22 of the top plate 10.

During assembly of the socket, the contact elements 40, 41 and 42 are stitched along each side 35 of the socket body 20 into the recesses 36. The four cam members 50 are placed above the contact elements with the rocker arms 51 engaging the cradles 37. The recesses 54 of the cam members 50 are positioned over the lobe 47 of each contact element to slidably engage the lobe. The top plate 10 is then placed onto the socket body 20 and the guide members 18 and hooks 19 are directed into their respective openings 31 and recesses 32 to lock the top plate thereon. The vertical movement of the top plate 10 toward and away from the socket body 20 causes the rounded surfaces 56 or the cam followers 55 to follow the cam surfaces 22 and the surfaces of the bar 52, on the inner edge of and inside the recesses 54, slidably engage the lobes 47 of each contact element, forcing the contacting portion 46 of the contact elements 40, 41 and 42 to be retracted against the inherent resilient biasing forces of the contact portion 45. The support frame 25 is then assembled onto the socket body 20 and the locking projections 27 fit into slotted openings 33 on the inner surface of the buttresses 30 and the posts 28 are positioned in openings 34. This construction positions the support frame over part of the anchor portion 44 of the contacts 41 and the contacts 40 are partially recessed beneath the support frame and the IC device, when in operation. The form of the resilient portion of the contact elements also will afford greater nesting of the socket elements with the support frame and IC device. This allows for a reduction in the area occupied by the entire socket assembly by reducing the distance from the center of the IC device to each edge of the socket assembly in a quad device of the sides in a linear device.

Figure 3:
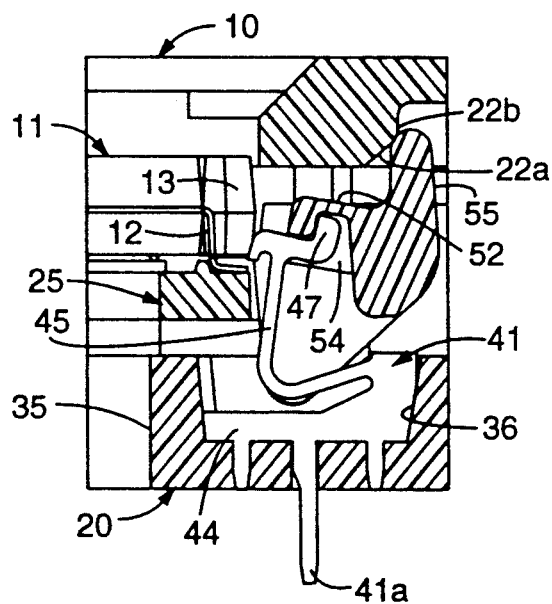
FIG. 3 is a fragmentary vertical sectional view of one side of the assembled socket assembly with an IC device shown in position in the socket assembly with the contact elements moved to the retracted IC device released position by movement of the top plate toward the socket body through part of the travel movement.
Figure 4:
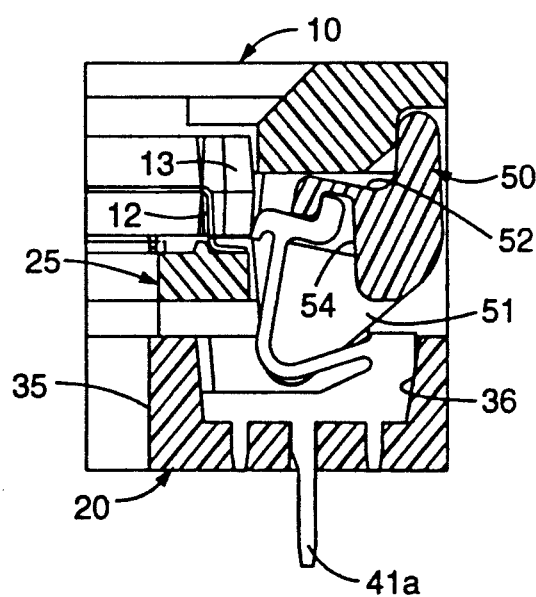
FIG. 4 is a fragmentary vertical sectional view of one side of the assembled socket assembly with an IC device shown in position in the socket assembly with the contact elements in the fully retracted position and the top plate moved toward the socket body and against the travel stop.

As assembled, the cam surfaces 22 on the top plate 10 are engaged by the cam followers 55. The cam surfaces 22 comprise a first face 22a which initially drives the cam members 50 to rotate about the cradle 37 to retract the contact elements. See FIG. 2 where the first surface 22a is in contact with the rounded surface 56 of the cam follower 55. In FIG. 3, the top plate 10 has moved to a position with relationship to the socket body to retract the contact elements by rocking the cam members 50. In FIG. 4, the rounded surfaces 56 of the cam followers 55 have passed over a ridge or rib on the cam surface 22 against a second surface 22b which permits the top plate to move with a lower force to indicate to the operator that the contact elements have moved to the open, IC device receiving position.

Having thus described the present invention, it will be appreciated that changes or modifications can be made in the disclosed and described embodiments without departing from the invention as recited in the appended claims.

I claim:

1. A socket assembly for use with an integrated circuit device having a plurality of leads arranged along at least one side of the device, said assembly comprising:
    a socket body having a generally rectangular configuration and spaced parallel openings along at least one side,
    a plurality of generally planar contact elements disposed in said openings in spaced parallel relationship along said at least one side of said socket body, each contact element comprising a connecting pin portion for making connection with an external electronic member, an anchor portion for anchoring each said contact element to said socket body, an arcuate resilient portion leading to a head, contacting means on said head for making resilient pressure contact with a said integrated circuit device and a lobe on said head extending in a direction away from said resilient portion, and
    a top plate movable in relationship to said socket body for affording movement of said contacting means from a first normal portion to an open position for receiving a said integrated circuit device and to an operative position in pressure electrical contact with a said integrated circuit device, and
    a cam member positioned over said lobes of said contact elements along said at least one side of said socket body, which cam member is supported by said socket body and said lobes of said contact elements, said cam member having rocker arms at each end thereof, seated in side walls which are located substantially at a bottom portion of said socket body, affording oscillatory movement of said cam member and surface means engaging each said lobe of the contact elements to urge said contacting means thereof from said normal position said open position, and said top plate has a cam surface extending along a side thereof for cooperatively engaging a cam follower extending the length of said cam member for moving said cam and contact elements to said open position upon movement of said top plate toward said socket body and to release said contact elements upon movement thereof in a direction away from said socket body.

2. A socket according to claim 1 wherein said cam follower comprises a member which extends along the length of the cam member for engaging said cam surface of said top plate which member and cam surface rock said cam member in a direction to move said contacting means of said contact elements from said first position.

3. A socket according to claim 2 wherein said cam comprises a bar having a longitudinal axis and spaced slotted recesses formed in a surface thereof to fit about and cover the lobes extending from the head of said contact elements in a direction away from said resilient portion of said contact elements for sliding engagement with said lobes of said contact elements for urging said contacting means from said first position to said open position.

4. A socket according to claim 3 wherein said rocker arms are positioned in cradles spaced along said one side of said socket body for affording oscillatory movement for said cam member for affording movement of said contact members.

5. A socket assembly for use with an integrated circuit device having a plurality of leads arranged along at least one side of the device, said assembly comprising;
    a socket body having a generally rectangular configuration and spaced parallel openings along at least one side,
    a plurality of generally planar contact elements disposed in said openings in spaced parallel relationship along said at least one side of said socket body, each contact element comprising a connecting pin portion for making connection with an external electronic member, an anchor portion supporting said connecting pin portion and anchoring each said contact element to said socket body, an arcuate resilient portion leading to a head, said head including contacting means for making resilient pressure contact with a said integrated circuit device, and a lobe extending from the head of said contact elements in a direction away from said resilient portion,
    a support frame for supporting an integrated circuit device, said support frame being supported on said socket body and extending partially over said anchor portion of said contacts.
    a top plate movable in relationship to said socket body for affording movement of said contacting means from a first normal portion to an open position for receiving a said integrated circuit device and to an operative position in pressure electrical contact with a said integrated circuit device, and
    a cam member positioned along said at least one side of said socket body, said cam member being supported by said socket body and positioned over said lobes of said contact elements and having means engaging said top plate and each said contact element to urge said contacting means thereof from said normal position to said open position, and said cam member being provided with rocker arms cradled in side walls which are located substantially at a bottom portion of said socket body affording oscillatory movement of said cam member and affording a mechanical advantage to retracting force necessary to flex said resilient portions of said contact elements.

* * * * *

UNITED STATES PATENT AND TRADEMARK OFFICE
CERTIFICATE OF CORRECTION

PATENT NO.   : 5,288,240
DATED        : February 22, 1994
INVENTOR(S)  : John A. Savant It is certified that error appears in the above-indentified patent and that said Letters Patent is hereby corrected as shown below:

Column 6, Line 66, "to retracting force" should read -- to a retracting force --.

Signed and Sealed this

Twenty-eight Day of March, 1995

*Attest:*

BRUCE LEHMAN

*Attesting Officer*    Commissioner of Patents and Trademarks